United States Patent
Meura (10) Patent No.: US 8,079,141 B2
(45) Date of Patent: Dec. 20, 2011

(54) ELECTRICAL CONNECTION AND METHOD OF MANUFACTURING THE SAME

(75) Inventor: Toru Meura, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 12/866,457

(22) PCT Filed: Feb. 24, 2009

(86) PCT No.: PCT/JP2009/000780
§ 371 (c)(1), (2), (4) Date: Aug. 6, 2010

(87) PCT Pub. No.: WO2009/107357
PCT Pub. Date: Sep. 3, 2009

(65) Prior Publication Data
US 2010/0313416 A1    Dec. 16, 2010

(30) Foreign Application Priority Data
Feb. 29, 2008 (JP) .................................. 2008-050628

(51) Int. Cl.
*H01R 9/00* (2006.01)
*B23K 31/00* (2006.01)

(52) U.S. Cl. .......... 29/843; 29/840; 29/844; 228/180.22

(58) Field of Classification Search ............. 29/825, 29/830, 842, 843
See application file for complete search history.

(56) References Cited

U.S. PATENT DOCUMENTS

| 6,590,287 B2 * | 7/2003 | Ohuchi ..................... 257/738 |
| 7,170,185 B1 * | 1/2007 | Hogerton et al. ......... 257/780 |
| 7,331,502 B2 * | 2/2008 | Okada et al. .......... 228/180.22 |
| 2010/0059872 A1 | 3/2010 | Katsurayama |

FOREIGN PATENT DOCUMENTS

JP     04-280443     10/1992
(Continued)

OTHER PUBLICATIONS

International Search Report for International Application No. PCT/JP2009/000780, Apr. 7, 2009.

*Primary Examiner* — Carl Arbes
(74) *Attorney, Agent, or Firm* — Ditthavong Mori & Steiner, P.C.

(57) ABSTRACT

The method for providing the solder connection of the present invention is a method for providing a solder connection, which electrically connects a first electronic component having a solder bump to a second electronic component having a protruded electrode to provide electrical connection between the first solder bump and the protruded electrode, wherein a relation of: A+B>C is satisfied, where a height of the first solder bump from one surface of the first electronic component is presented as A [μm], a height of the protruded electrode before the compressive deformation from one surface of the second electronic component is presented as B [μm], and a thickness of the adhesive agent layer is presented as C [μm], and further comprising: disposing the adhesive agent layer in the first electronic component; and deforming the first solder bump and the protruded electrode and providing a contact of the above-described protruded electrode with the above-described first solder bump, so that the sum of the height A [μm] of the first the solder bump and the height B [μm] of the above-described protruded electrode is substantially equivalent to the thickness C [μm] of the above-described adhesive agent layer.

18 Claims, 6 Drawing Sheets

FOREIGN PATENT DOCUMENTS

| | | |
|---|---|---|
| JP | 2000-244114 | 9/2000 |
| JP | 2005-209833 | 8/2005 |
| JP | 2007-059538 | 3/2007 |
| JP | 2007-141963 | 6/2007 |
| JP | 2007-258508 | 10/2007 |
| WO | WO 2008-023452 | 2/2008 |

* cited by examiner

FIG. 5

ELECTRICAL CONNECTION AND METHOD OF MANUFACTURING THE SAME

TECHNICAL FIELD

The present invention relates to a method for providing a solder connection, an electronic equipment and a method for manufacturing same.

BACKGROUND ART

Requirements for enhanced characteristics and lighter and more compact features of electronic equipments in recent years promote high-density integration and high-density installation of electronic components such as semiconductor packages and the like, and miniaturization and high pin count of such electronic components are progressing. A solder joint is employed for obtaining electric coupling for the electronic components, and for example, it is employed for a conducting junction between semiconductor chips, a conducting junction between a semiconductor chip and a circuit board such as such as a package having a flip-chip device installed therein, a conducting junction between a circuit board and a circuit board. Further, requirements for reduced thickness, miniaturization, fine-pitch junction for electronic component promotes a proposal, in which an underfill material is supplied in a solder joint by utilizing capillary phenomenon and then the joint is reinforced to ensure reliability of the junction.

When a gap generated by a solder joint is reinforced with a resin such as an underfill material, a use of the resin at a quantity, which is larger than a volume of a space formed by the gap to be filled, may cause an excessive resin effusing over unwanted locations, causing, for example a pollution of a device or reducing an dimensional area of a terminal available for installing other components due to the effused resin. Further, the approach for employing the underfill material utilizing capillary phenomenon requires a number of operations for stuffing with the underfill material, which leads to one of the reasons for increasing the production cost. Thus, an approach is proposed in the process for coupling the semiconductor element to the substrate, including dropping a mixture of an underfill material with a flux, and then curing the underfill material simultaneously creating a solder-joint. Such assembly process is effective in providing significantly reducing the production cost since the operation for filling the underfill material is not required.

For example, Patent Document 1 describes a method for creating an interconnection of an electronic component with a substrate. Such method involves disposing a binding material between a solder bump formed in the electronic component and a patterned metal formed in the substrate to provide a connection between the solder bump and the patterned metal. More specifically, first of all, the electronic component and the substrate are suitably aligned so that the patterned metal having a coating of the binding material faces the solder bump. Subsequently, a vacuum press apparatus is employed, and the solder bump is approached to and abutted to the patterned metal and then is squashed until the solder bump is deformed to compressively bond thereof. The binding material is eliminated in this process from the contact point between the solder bump and the patterned metal. Then, a reflow process is conducted to provide a junction between the solder bump and the patterned metal, and the adhesive agent is cured to provide a connection between the electronic component and the substrate.

[Patent Document 1]
Japanese Patent Laid-Open No. H04-280,443

DISCLOSURE OF THE INVENTION

However, in the technology described in Patent Document 1, the binding material coated with a metalized pattern is caught between the solder bump and the metalized pattern, causing a problem of an electrical coupling failure.

An object of the present invention is to provide a method for providing a coupling to a solder through an adhesive agent layer having a flux function with enhanced reliability. Another object of the present invention is to provide an electronic equipment with improved reliability.

According to one aspect of the present invention, there is provided a method for providing a solder connection, which electrically connects a first electronic component having a solder bump to a second electronic component having a protruded electrode, comprising: forming an adhesive agent layer in a surface that is the same with one surface of a surface for forming the solder bump provided in the first electronic component and a surface for forming the protruded electrode provided in the second electronic component; disposing the solder bump so as to face the protruded electrode to align the first electronic component with the second electronic component; and heating and compressing the solder bump and the protruded electrode while the solder bump and the protruded electrode in mutually facing arrangement are in contact with each other to cause a compressive deformation of the solder bump and the protruded electrode, wherein the adhesive agent layer is formed in the forming the adhesive agent layer so as to satisfy a relation of: $A+B>C$, where a height of the solder bump before the compressive deformation is presented as A [μm], a height of the protruded electrode before the compressive deformation is presented as B [μm], and a thickness of the adhesive agent layer is presented as C [μm], and the solder bump and the protruded electrode is compressively deformed in the heating and compressing the solder bump and the protruded electrode so as to satisfy a relation of: $D+E$ is substantially equivalent to C, where a height of the solder bump after the compressive deformation is presented as D [μm], and a height of the protruded electrode after the compressive deformation is presented as E [μm].

According to another aspect of the present invention, there is provided an electronic equipment comprising a solder connection, connected by the above-described method for providing the solder connection.

According to further aspect of the present invention, there is provided a method for manufacturing an electronic equipment by employing the above-described method for providing the solder connection.

According to the present invention, the protruded electrode is in contact with the solder bump through the adhesive agent layer and then the compressive bonding and deformation is further conducted, so that the convex-shaped configurations of both members can be utilized to eliminate the adhesive agent layer from a contact point of the solder bump and the protruded electrode with higher efficiency. Further, the adhesive agent layer is formed so as to satisfy a relation of: $A+B>C$, where a height of the solder bump before the compressive deformation is presented as A [μm], a height of the protruded electrode before the compressive deformation is presented as B [μm], and a thickness of the adhesive agent layer is presented as C [μm], and the solder bump and the protruded electrode is compressively deformed so as to satisfy a relation of: $D+E$ is substantially equivalent to C, where a height of the solder bump after the compressive deformation is presented as D [μm], and a height of the protruded electrode after the compressive deformation is presented as E [μm]. This allows eliminating the adhesive agent layer without any residue in the contact point of the solder bump and the protruded electrode. Therefore, enhanced electrical coupling can be obtained in the solder connection.

According to the present invention, a method for providing a coupling to a solder through an adhesive agent layer having a flux function with enhanced reliability can be provided.

Further, according to the present invention, an electronic equipment with improved reliability can be provided.

BRIEF DESCRIPTION OF THE DRAWINGS

The above and other objects, advantages and features of the present invention will be more apparent from the following description of certain preferred embodiments taken in conjunction with the accompanying drawings.

BEST MODE FOR CARRYING OUT THE INVENTION

Exemplary implementations according to the present invention will be described in detail as follows in reference to the annexed figures. In all figures, an identical numeral is assigned to an element commonly appeared in the figures, and the detailed description thereof will not be repeated.

Figure 1:
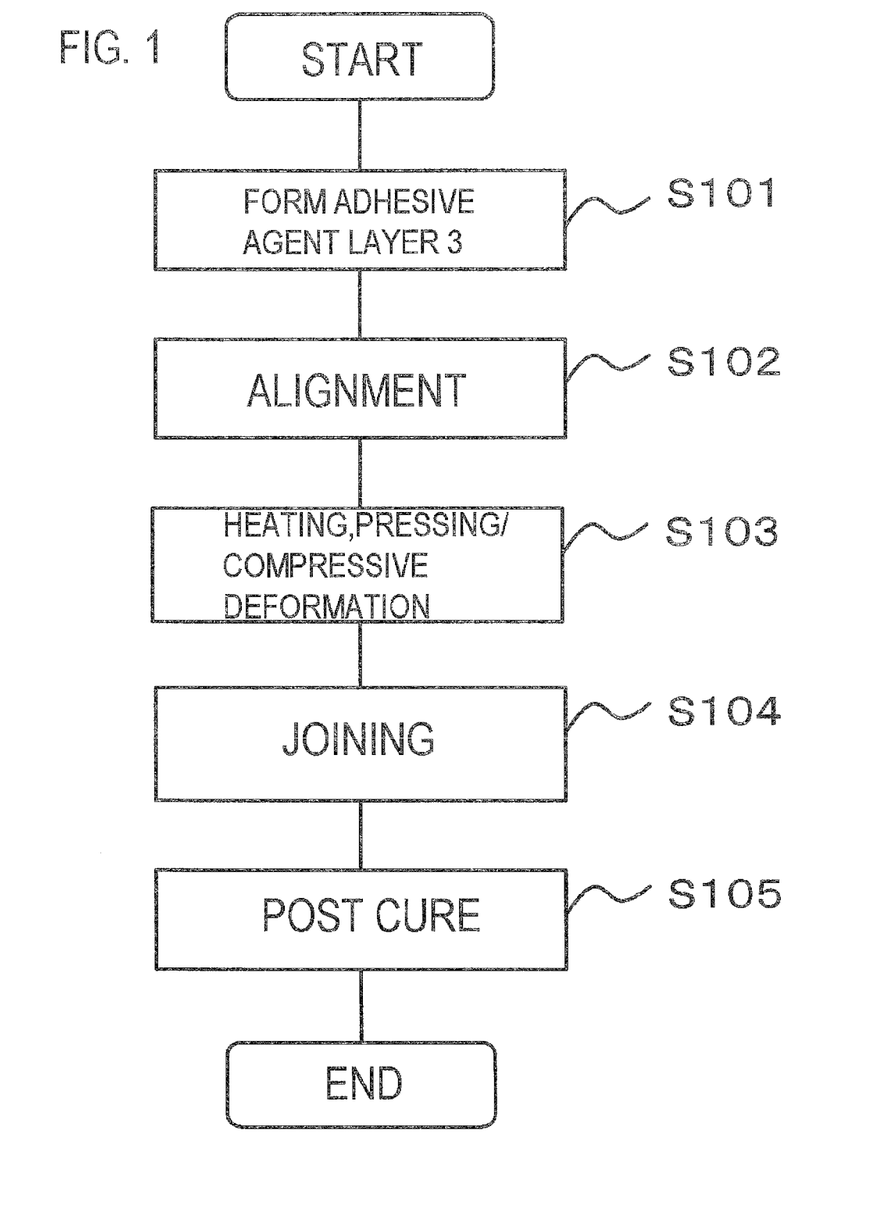
FIG. 1 It is a flow chart for describing a method for providing a solder connection according to the present embodiment.
Figure 5:
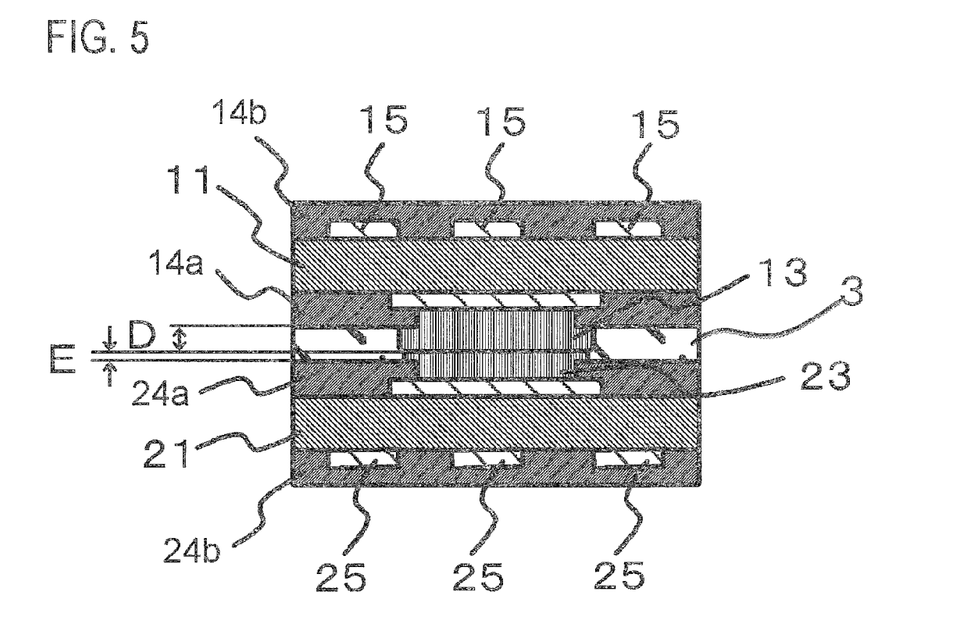
FIG. 5 It is a cross-sectional view, illustrating 5104 of FIG. 1 in an embodiment of the present invention.
Figure 6:
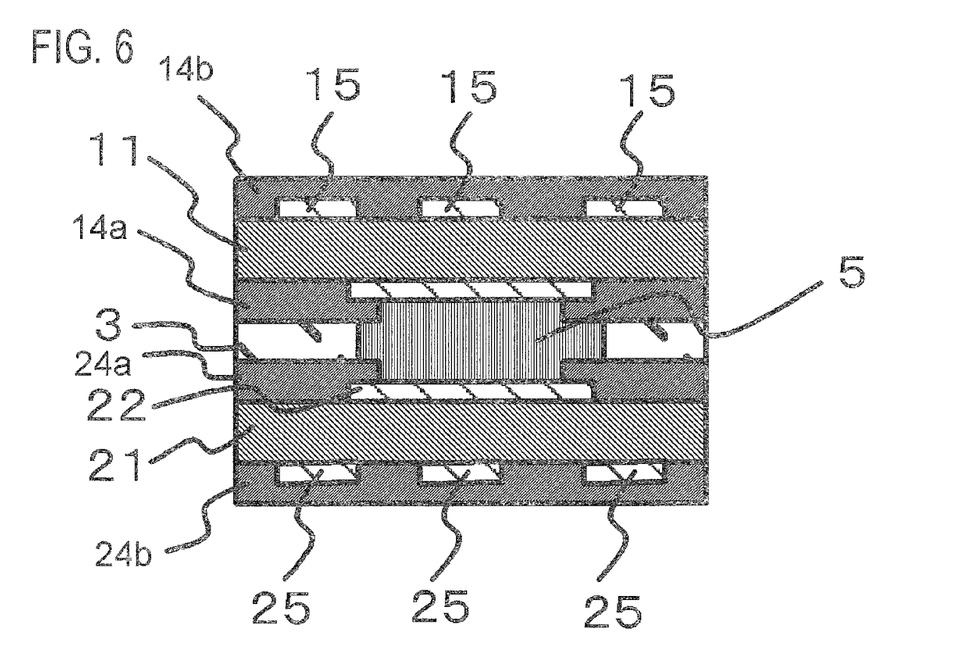
FIG. 6 It is a cross-sectional view, illustrating 5105 of FIG. 1 in an embodiment of the present invention.

A method for providing a solder connection according to the present invention is a method for providing a solder connection for electrically connecting a first electronic component 1 having a solder bump 13 with a second electronic component 2 having a protruded electrode 23. FIG. 1 is a flow chart, useful in describing the method for providing the solder connection of the present embodiment. FIG. 2 to FIG. 6 are cross-sectional views for describing a method for providing a solder connection in an embodiment involving forming an adhesive agent layer 3 in a surface that is the same with one surface of a surface for forming a solder bump 13 provided in a first electronic component 1, which is included in methods for providing solder connections according to the present invention. The present embodiment includes: an operation for forming the adhesive agent layer 3 in a surface for forming the solder bump 13 provided in the first electronic component 1 (S101, FIG. 3); an operation for disposing the solder bump 13 so as to face a protruded electrode 23 to align the above-described first electronic component 1 having the adhesive agent layer 3 with the second electronic component 2 (S102, FIG. 4); and an operation for heating and compressing the solder bump 13 and the protruded electrode 23 while the solder bump 13 and the protruded electrode 23 in mutually facing arrangement are in contact with each other to cause a compressive deformation (S103, FIG. 5). As shown in FIG. 3, the adhesive agent layer 3 is formed in the above-described operation (S101) for forming the adhesive agent layer 3 so as to satisfy a relation of: A+B>C, where a height of the solder bump 13 before the compressive deformation is presented as A [μm], a height of the protruded 23 electrode before the compressive deformation is presented as B [μm], and a thickness of the adhesive agent layer 3 is presented as C [μm]. As shown in FIG. 5, the solder bump 13 and the protruded electrode 23 are deformed in the in the above-described operation (S103) for heating and compressing the solder bump 13 and the protruded electrode 23 so as to satisfy a relation of: D+E is substantially equivalent to C, where a height of the solder bump 13 after the compressive deformation is presented as D [μm], and a height of the protruded electrode 23 after the compressive deformation is presented as E [μm].

The present embodiment will be more specifically described below. In the present embodiment, the adhesive agent layer 3 is composed of a resin composition containing a thermosetting resin and a chemical compound exhibiting a flux activity. The details of the resin composition constituting the adhesive agent layer 3 will be described later.

In the present embodiment, the solder bump 13 is composed of a solder alloy. For example, a lead-free solder such as tin/silver (Ag)-based solder or the like is employed.

Prior to S102, a heat treatment operation for pre-curing the thermosetting resin of the resin composition constituting the adhesive agent layer 3 may be additionally conducted as required. Such pre-curing is a process for curing at a temperature lower than a final glass transition temperature, and the pre-curing allows partially accelerating the cure of the thermosetting resin in the resin composition constituting the adhesive agent layer 3, whereby enabling an adjustment of the minimum melt viscosity of the adhesive agent layer 3.

The solder bump 13 is disposed so as to face the protruded electrode 23 to align the first electronic component 1 having the adhesive agent layer 3 with the second electronic component 2 in S102, and then, the solder bump 13 and the protruded electrode 23 are heated and compressed while the solder bump 13 and the protruded electrode 23 in mutually facing arrangement are in contact with each other to cause a compressive deformation in S103. In S103, the heating is started simultaneously with or prior to the pressurization, and in order to suitably adjust the viscosity of the adhesive agent layer 3, a heating and compressing unit such as a power press and the like may be preliminarily configured at a predetermined temperature, or alternatively be heated to elevate the temperature after the first electronic component 1 and the second electronic component 2 are installed. When the heating and compressing unit such as a power press is preliminarily configured at a predetermined temperature, the temperatures of the first electronic component 1 and the second electronic component 2 are rapidly increased at the stage of being installed on the heating and compressing unit and are reached at the predetermined temperature in several seconds, since both of the first electronic component 1 and the second electronic component 2 have smaller heat capacities. When the first electronic component 1 and the second electronic component 2 are heated to elevate the temperature after they are installed to the heating and compressing unit, the temperatures of the first electronic component 1 and the second electronic component 2 are elevated as following the temperature elevation of the heating and compressing unit. In the present embodiment involving forming the adhesive agent layer 3 in the surface for forming the solder bump 13 provided in the first electronic component 1, it is preferable to heat at least the first electronic component 1.

In S103, in view of allowing easier elimination of the adhesive agent layer 3 from the section between the solder bump 13 and the protruded electrode 23, it is preferable to use the adhesive agent layer 3 which a viscosity of the adhesive agent layer measured at a frequency of 1.0 Hz in the event of elevating the temperature starting from 25 degrees C. until it is melted at a temperature ramp rate of 10 degrees C./minute, is first decreased as an increase of the temperature until reaching to the minimum melt viscosity, and then increased as an increase of the temperature, and the minimum melt viscosity is 10 to 10,000 Pa·s.

In S103, the condition "D+E is substantially equivalent to C" means the condition that the adhesive agent layer 3 is disposed between the first electronic component 1 and the second electronic component 2 without generating an overflow and without generating a gap. More specifically, it means that the sum of D and E is 0.9 to 1.1 times of C.

Further, in S103, the compressive deformation rate α (quantity of squash) of the solder bump 13 and the protruded electrode 23 may be represented by α=(D+E)/(A+B). α may be preferably 0.3 to 0.9, and more preferably 0.5 and 0.7.

It is more preferable in S103 that the solder bump 13 and the protruded electrode 23 are heated to a temperature lower than the melting temperature of the solder bump 13. More specifically, it is preferable to heat at a temperature that is lower than the melting temperature of solder or the melting point of solder.

After the S103, the solder bump 13 and the protruded electrode 23 are melted to be joined (S104, FIG. 6), so that the solder bump 13 and the protruded electrode 23 are joined to create a solder connection section. Then, a post cure for the adhesive agent layer 3 is further conducted (S105). Such post-curing is a process for completely carrying out the cure reaction of the thermosetting resin in the resin composition constituting the adhesive agent layer 3. This causes the cure of the adhesive agent layer 3 to form an insulating layer between the first electronic component 1 and the second electronic component 2.

The method for providing the solder connection will be further described in detail.

Figure 2:
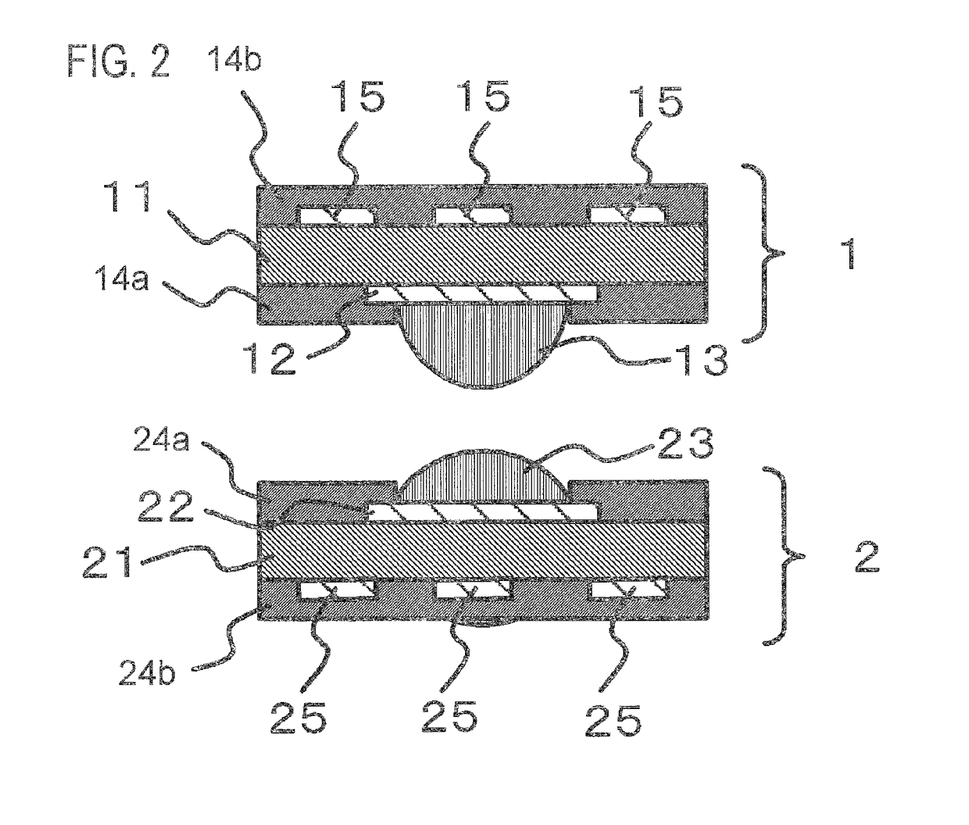
FIG. 2 It is a cross-sectional view for describing a method for providing a solder connection according to an embodiment of the present invention.
Figure 3:
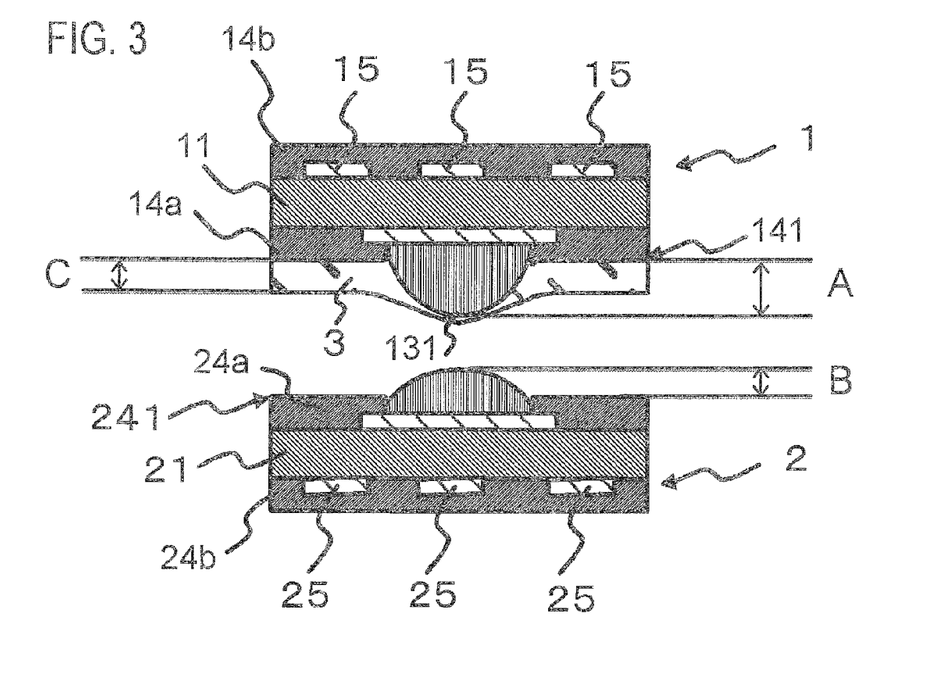
FIG. 3 It is a cross-sectional view, illustrating 5101 of FIG. 1 in an embodiment of the present invention.
Figure 4:
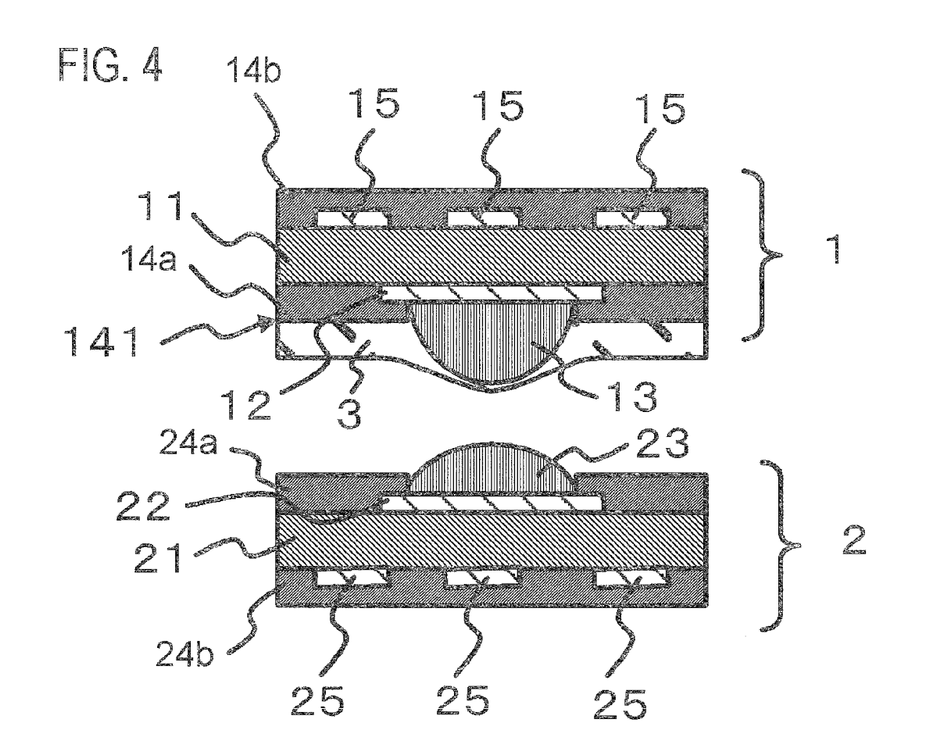
FIG. 4 It is a cross-sectional view, illustrating 5102 of FIG. 1 in an embodiment of the present invention.

First of all, as shown in FIG. 2, a first substrate 1 is prepared as the first electronic component 1, and a second substrate 2 is prepared as the second electronic component 2 (FIG. 2).

The first substrate 1 includes a core substrate 11, a terminal 12 provided in one surface (in the side of the bottom in FIG. 2) of the core substrate 11, a solder bump 13 provided to cover the terminal 12, a solder resist 14a covering the side of one surface of the core substrate 11, a circuit wiring 15 provided in the side of the other surface (in the side of the top in FIG. 2) of core substrate 11, and a solder resist 14b provided so as to cover the side of the other surfaces of the circuit wiring 15 and the core substrate 11.

The second substrate 2 includes a core substrate 21, a terminal 22 provided in one surface (in the side of the top in FIG. 2) of the core substrate 21, a protruded electrode 23 provided so as to cover the terminal 22, a solder resist 24a covering the side of one surface of the core substrate 21, a circuit wiring 25 provided in the side of the other surface (in the side of the bottom in FIG. 2) of core substrate 21, and a solder resist 24b provided so as to cover the side of the other surfaces of the circuit wiring 25 and the core substrate 21.

Typical materials available in the use for the protruded electrode 23 may include solder, copper, gold, silver, aluminum, nickel or the like, and preferably copper and nickel, which is capable of creating an intermetallic compound with the solder bump 13, and more preferably solder and gold, with which the protruded electrode is melted in the solder bump 13 to create a unified body. Further, one of the above-mentioned materials may be employed alone, or a combination of a plurality of these materials may be employed. For example, solder is formed only in a tip section of a protruded section of copper to provide the solder connection section having higher coupling reliability. Further, the material for the protruded electrode 23 may be a solder alloy that is similar to the material for the solder bump 13. The available shape for the above-described protruded electrode 23 may be hemispherical shape, cylindrical shape, concave shape such as gold wire bump and the like.

Next, the adhesive agent layer 3 having a flux function is laminated in the side of the first substrate 1 provided with the solder bump 13 to dispose the adhesive agent layer 3 having a flux function (FIG. 3). In such case, the relation A+B>C is satisfied, where the height A [μm] of the solder bump 13 is a height from one surface of the first substrate 1 (lower surface 141 of the solder resist 14a in the bottom side of the first substrate 1 in FIG. 3), the height B [μm] of the protruded electrode 23 is a height from one surface of the second substrate 2 (upper surface 241 of the solder resist 24a in the top side of the second substrate 2 in FIG. 3), and the thickness of the adhesive agent layer 3 having a flux function is represented by C [μm]

Therefore, the solder bump 13 is in contact with the protruded electrode 23 by the heating and compression bonding, and they are squashed while eliminating the adhesive agent layer 3 disposed between the solder bump 13 and the protruded electrode 23, so that a tip section 131 of the solder bump 13 is more easily exposed, as compared with the adhesive agent layer 3 having a flux function. This prevents the adhesive agent layer 3 having a flux function from being disposed between the solder bump 13 and the protruded electrode 23 during the creation of the solder connection (resin clogging).

More specifically, the relation of 10≦A+B−C≦100 may be preferably satisfied, and in particular the relation of 20≦A+B−C≦35 may be more preferably satisfied, where the height A [μm] of the solder bump 13 from one surface of the first substrate 1 (lower surface 141 of the solder resist 14a in the bottom side of the first substrate 1), the height B [μm] of the protruded electrode 23 from one surface of the second substrate 2 (upper surface 241 of the solder resist 24a in the top side of the second substrate 2), and the thickness C [μm] of the adhesive agent layer 3 having a flux function. The relation of A, B and C within the above-described ranges allows reducing the resin clogging, and in addition, reducing the effused resin by the compression, and further reducing an expansion of the solder bump width due to a deformation of the solder bump.

Specifically, the sum of the height A [μm] of the solder bump 13 from one surface 141 of the first substrate 1 and the height B [μm] of the protruded electrode 23 from one surface 241 of the second substrate 2 is not particularly limited, and is preferably 20 to 400 μm, and in particular, more preferably 50 to 65 μm. The sum of the heights within the above range provides a formation of a large number of terminals for coupling within the member, and thus mutual contacts of the solder bumps are easily created by compressing to the thickness of the adhesive agent layer even if the variation in the height for forming the solder is increased to a certain extent, whereby providing enhanced production yield for obtaining the solder connection section with improved quality.

The thickness C [μm] of the adhesive agent layer 3 having a flux function is not particularly limited, and is preferably 10 to 390 μm, and in particular, more preferably 30 to 35 μm. The thickness within the above range provides enhanced balance between the coupling reliability and the effect for reducing a generation of a void within the adhesive agent layer.

This adhesive agent layer 3 having a flux function is composed of a resin composition containing, for example, a thermosetting resin and a chemical compound exhibiting a flux activity.

The aforementioned thermosetting resin typically includes, for example, epoxy resins, oxetane resins, phenolic resins, (meta) acrylate resins, unsaturated polyester resins, diallyl phthalate resins, maleimide resins and the like. Among these, epoxy resins exhibiting better curability and storage stability, better thermal resistance of the cured product, better humidity resistance and better chemical resistance are preferably employed.

Either an epoxy resin in a form of a solid at a room temperature (25 degrees C.) or an epoxy resin in a form of a liquid at the room temperature may be employed. Alternatively, a combination of an epoxy resin in a form of solid at a room temperature and an epoxy resin in a form of liquid at the room temperature may be employed. This allows further enhancing the design flexibility in the hot melt behavior of the resin.

The aforementioned epoxy resin in a form of a solid at a room temperature is not particularly limited, and typically includes bisphenol A epoxy resins, bisphenol S epoxy resins, phenolic novolac epoxy resins, creosol novolac epoxy resins, glycidyl amine epoxy resins, glycidyl ester epoxy resins, trifunctional epoxy resins, tetrafunctional epoxy resins and the like. More specifically, it may contain a solid trifunctional epoxy resin and a creosol novolac epoxy resin.

Alternatively, the aforementioned epoxy resin in a form of a liquid at the room temperature may be a bisphenol A epoxy resin or a bisphenol F epoxy resin. Alternatively, these may be combined to be employed.

The content of the aforementioned thermosetting resin is not particularly limited, and may be preferably 25 to 75% by weight over the whole of the above described resin composition, and in particular, more preferably 45 to 70% by weight. The content within the above range provides enhanced curability and allows the design flexibility with enhanced hot melt behavior of the resin.

The aforementioned chemical compound exhibiting a flux activity has functions including a reducing ability for inducing a reduction for an oxide film on the surface of the electrode terminal such as the solder bump that blocks the connection, thus removing the oxide film. The aforementioned chemical compound exhibiting a flux activity is determined as, for example, a compound containing at least one carboxylic group and/or phenolic hydroxyl group in molecule, and may be a liquid or a solid.

The aforementioned flux-activating compound containing carboxylic group typically includes aliphatic acid anhydrides, alicyclic acid anhydrides, aromatic acid anhydrides, aliphatic carboxylic acids, aromatic carboxylic acids and the like. A flux-activating compound having phenolic hydroxyl group typically includes phenols.

The aforementioned aliphatic acid anhydrides typically include succinic anhydride, polyadipicacid anhydride, polyazelaicacid anhydride, polysebacicacid anhydride and the like.

The aforementioned alicyclic acid anhydride typically includes methyl tetrahydro phthalic anhydride, methyl hexahydro phthalic anhydride, methyl himic acid anhydride, hexahydro phthalic anhydride, tetrahydro phthalic anhydride, trialkyl tetrahydro phthalic anhydride, methylcyclohexene dicarboxylic anhydride and the like.

The aforementioned aromatic acid anhydride typically includes phthalic anhydride, trimellitic anhydride, pyromellitic dianhydride, benzophenone tetracarboxylic acid anhydride, ethylene glycol bis trimelitate, glycerol tris trimelitate and the like.

The aforementioned aliphatic carboxylic acid typically includes a compound presented by the following formula (I).

[formula 1]

$$HOOC—(CH_2)_n—COOH \quad (1)$$

[n is an integer of equal to or more than 0 and equal to or less than 20.]

Here, "n" in the above-described formula (I) may be preferably equal to or higher than 3 and equal to or lower than 10, in view of balancing flux activity, outgassing during creation of junction, and elastic modulus and glass transition temperature of the cured product of the adhesive agent. "n" within this range achieves that can be uniformly melted without generating a void. Therefore, the cure of the adhesive agent layer can be achieved without generating outgas. "n" of equal to or higher than 3 provides an inhibition to an increase in the elastic modulus of the cured product of the adhesive agent, thereby providing improved adhesiveness with an object for the adhesion. Besides, "n" of equal to or lower than 10 provides an inhibition to a deterioration of the elastic modulus, thereby providing further improved coupling reliability.

Typical compounds shown in the above-described formula (I) include, for example: n=3, glutaric acid (HOOC—$(CH_2)_3$—COOH); n=4, adipic acid (HOOC—$(CH_2)_4$—COOH); n=5, pimelic acid (HOOC—$(CH_2)_5$—COOH); n=8, sebacic acid (HOOC—$(CH_2)_8$—COOH); and n=10, dodecane diacid (HOOC—$(CH_2)_{10}$—COOH).

Other aliphatic carboxylic acids include formic acid, acetic acid, propionic acid, butyric acid, valeric acid, pivalic acid, caproic acid, caprylic acid, lauric acid, myristic acid, palmitic acid, stearic acid, acrylic acid, methacrylic acid, crotonic acid, oleic acid, fumaric acid, maleic acid, oxalic acid, malonic acid, succinic acid, and the like.

The aforementioned aromatic carboxylic acid typically includes benzoic acid, phthalic acid, isophthalic acid, terephthalic acid, hemimellitic acid, trimellitic acid, trimesic acid, mellophanic acid, prehnitic acid, pyromellitic acid, mellitic acid, triyl acid, xylic acid, hemellitic acid, mesitylenic acid, prehnitylic acid, toluic acid, cinnamic acid, salicylic acid, 2,3-dihydroxybenzoic acid, 2,4-dihydroxybenzoic acid, gentisic acid (2,5-dihydroxybenzoic acid), 2,6-dihydroxybenzoic acid, 3,5-dihydroxybenzoic acid, gallic acid (3,4,5-trihydroxybenzoic acid), naphthoic acid derivatives such as 1,4-dihydroxy-2-naphthoic acid, 3,5-dihydroxy-2-naphthoic acid and the like; phenolphthalin; diphenolic acid and the like.

The aforementioned flux-activating compound having phenolic hydroxyl group typically includes monomers having phenolic hydroxyl group such as phenol, o-creosol, 2,6-xylenol, p-creosol, m-creosol, o-ethylphenol, 2,4-xylenol, 2,5-xylenol, m-ethylphenol, 2,3-xylenol, mesitol, 3,5-xylenol, p-tertiary butylphenol, catechol, p-tertiary amyl phenol, resorcinol, p-octyl phenol, p-phenylphenol, bisphenol A, bisphenol F, bisphenol AF, biphenol, diallyl bisphenol F, diallyl bisphenol A, tris phenol, tetrakis phenol and the like, phenolic novolac resin, o-creosol novolac resin, bisphenol F novolac resin, bisphenol A novolac resin and the like.

Since the aforementioned flux-activating compound is three-dimensionally taken via a reaction with a thermosetting resin such as an epoxy resin or the like, a preferable compound is a compound having, in one molecule, at least two phenolic hydroxyl groups, which is capable of being added to the epoxy resin, and at least one carboxylic group directly bonded to aromatic ring, which exhibits a flux effect for a metal oxide film. Such compound typically includes: benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid, gallic acid (3,4,5-trihydroxybenzoic acid) and the like; naphthoic acid derivatives such as 1,4-dihydroxy-2-naphthoic acid, 3,5-dihydroxy-2-naphthoic acid, 3,7-dihydroxy-2-naphthoic acid and the like; phenolphthalin; and diphenolic acid and the like.

Each of these flux-activating compounds may be employed alone, or a combination of two or more thereof may be employed.

The content of the aforementioned chemical compound exhibiting a flux activity is not particularly limited, and 1% by weight. or higher of the whole of the aforementioned resin composition may be preferable in view of providing improved flux activity, and in particular 5% by weight. or higher may be more preferable. The residual thermosetting resin and the unreacted flux-activating compound may cause migration. Therefore, in order to avoid remaining the thermosetting resin and the flux-activating compound, the content of the flux-activating compound may be preferably equal to or lower than 30% by weight. of the whole of the aforementioned resin composition, and in particular more preferably equal to or lower than 25% by weight., though it is not particularly limited to any specific range. The content within the above range allows inducing a reduction of the oxide film on the surface of a copper foil, providing improved junction with higher strength.

The aforementioned resin composition is not particularly limited to any specific material, and may preferably contain a curing agent for the aforementioned thermosetting resin.

The aforementioned curing agent typically includes, for example, phenols, amines and thiols. When an epoxy resin is employed for the thermosetting resin, phenols are preferably employed, in view of providing improved reactivity with the epoxy resin, reduced dimensional change in the cure process, and appropriate physical property of the cured product (for example, thermal resistance, humidity resistance and the like). The resin composition without containing acid anhydride is resistant to moisture absorption, and thus increase in the viscosity of the adhesive agent layer can be prevented. Therefore, such composition is preferable since improved solder connection can be created.

The aforementioned phenols are not particularly limited to any specific compound, and when physical property of the cure product of the adhesive agent is considered, compounds with two or more functional groups may be preferable. For example, bisphenol A, tetramethyl bisphenol A, diallyl bisphenol A, biphenol, bisphenol F, diallyl bisphenol F, trisphenol, tetrakisphenol, phenol novolacs, creosol novolacs and the like may be typically employed, and when the melt viscosity, the reactivity with the epoxy resin and the physical property of the cured product are considered, phenol novolacs and creosol novolacs may be preferably employed.

When a phenol novolac is employed for the aforementioned curing agent, the content is not particularly limited, and may be preferably equal to or higher than 5% by weight of the whole of the aforementioned resin composition and in particular more preferably equal to or higher than 10% by weight, in view of ensuring the cure of the resin. The residual phenol novolac unreacted with epoxy resin may cause migration. Therefore, in order to avoid remaining as the residue, the content may be preferably equal to or lower than 30% by weight. of the whole of the aforementioned resin composition, and in particular more preferably equal to or lower than 25% by weight.

When an epoxy resin is employed for the thermosetting resin, the content of the phenol novolac resin may be determined by an equivalent ratio for the epoxy resin. More specifically, the equivalent ratio of the phenol novolac over the epoxy resin is not particularly limited, and may be preferably equal to or higher than 0.5 and equal to or lower than 1.2, and in particular preferably equal to or higher than 0.6 and equal to or lower than 1.1, and most preferably equal to or higher than 0.7 and equal to or lower than 0.98. The equivalent ratio of the phenol novolac resin for the epoxy resin of equal to or higher than the above described lower limit ensures the thermal resistance and the humidity resistance of the cured product, and the equivalent ratio of equal to or lower than the above-described upper limit allows reducing the unreacted amount of remaining phenol novolac resin and epoxy resin after curing, thereby achieving improved migration resistance.

Other types of available curing agents may include, for example, an imidazole compound having a melting point of equal to or higher than 150 degrees C. Excessively lower melting point of such imidazole compound may induce earlier cure of the resin in the adhesive agent before the solder powder moves to the surfaces of the electrode, so that it is concerned that unstable coupling or shorter shelf life of the adhesive agent is caused. Therefore, the imidazole compound having the melting point of equal to or higher than 150 degree C. is preferable. Typical imidazole compound having a melting point of equal to or higher than 150 degrees C. includes, for example, 2-phenyl hydroxy imidazole, 2-phenyl-4-methyl hydroxy imidazole and the like. In addition to above, the upper limit of the melting point of such imidazole compound is not particularly limited, and may be suitably selected according to, for example, an adhesion temperature of the adhesive agent.

When an imidazole compound is used for the above-described curing agent, the content thereof is not particularly limited, and may be preferably equal to or higher than $5 \times 10^{-3}$% by weight. and equal to or lower than 10% by weight. of the whole of the above-described resin composition, and in particular, more preferably equal to or higher than $1 \times 10^{-2}$% by weight. and equal to or lower than 5% by weight. The content of the above-described imidazole compound of equal to or higher than the above-described lower limit allows exhibiting the function as the curing catalyst for the thermosetting resin with further effectiveness, so that the curability of the adhesive agent can be improved. On the other hand, the content of the above-described imidazole compound of equal to or lower than the above-described upper limit allows providing the melt viscosity of the resin of not excessively high at a temperature for melting the solder, thereby providing improved solder joint configuration. Further, the storage stability of the adhesive agent can be further improved.

Each of these curing agents may be employed alone, or a combination of two or more thereof may be employed.

The above-described resin composition may preferably contain a film-forming resin, though it is not particularly limited. This allows providing improved film-forming ability for the film. The above-described film-forming resin typically includes, for example, phenoxy resins, polyester resins, polyurethane resins, polyimide resins, siloxane-modified polyimide resins, polybutadiene, polypropylene, styrene-butadiene-styrene copolymer, styrene-ethylene-butylene-styrene copolymer, polyacetal resins, polyvinylbutyral resins, polyvinylacetal resins, butyl rubber, chloroprene rubber, polyamide resins, acrylonitrile-butadiene copolymer, acrylonitrile-butadiene-acrylic acid copolymer, acrylonitrile-butadiene-styrene copolymer, poly vinyl acetate, nylon, acrylic rubber or the like. Each of these may be employed alone, or a combination of two or more thereof may be employed.

When a phenoxy resin is employed for the above-described film-forming resin, the number average molecular weight thereof is not particularly limited, and a phenoxy resin having the number average molecular weight of 5,000 to 15,000 may be preferable. The use of such a phenoxy resin allows inhibiting the flowability of the adhesive agent before the cure, thereby providing uniform inter-layer thickness. Backbone of the phenoxy resin may typically include bisphenol A type, bisphenol F type, biphenyl backbone type and the like, though it is not limited thereto. Preferably, a phenoxy resin having a saturated water absorption of equal to or lower than 1% may be preferably employed, since the use of such compound allows preventing a generation of foaming or delamination under the condition of higher temperature in the process for forming a junction time or installing a solder.

In addition, a compound having functional group such as nitrile group, epoxy group, hydroxy group, carboxylic group and the like may be employed for the above-described film-forming resin in order to provide improved adhesiveness and compatibility with other resin, and for example, acrylic rubber having functional group may be employed for such resin.

The use of the acrylic rubber (having functional group) for the above-described film-forming resin allows providing improved deposition stability in the process for producing a film-form adhesive agent. In addition, this also provides reduced elastic modulus of the adhesive agent and reduced residual stress between an object for the adhesion and the adhesive agent, so that the adhesiveness for object for the adhesion can be improved.

The content of the above-described film-forming resin is not particularly limited, and may be preferably equal to or higher than 5% by weight and equal to or lower than 45% by weight of the whole of the above-described resin composition. The addition of the film-forming resin at a content within the above-described range provides inhibiting a degradation of the film-formability and inhibiting an increase in the elastic modulus of the cured product of the adhesive agent, so that the adhesiveness for the object for the adhesion can be further improved. In addition, the content within the above-described range also allows inhibiting an increase in the melt viscosity of the adhesive agent.

The above-described resin composition is not particularly limited, and may be preferable to contain a silane coupling agent. This allows further enhancing the adhesiveness of the adhesive agent over the object for the adhesion. The above-described silane coupling agent typically includes, for example, epoxy silane coupling agent, aromatic-containing amino silane coupling agent or the like. Each of these may be employed alone, or a combination of two or more thereof may be employed.

The content of the silane coupling agent is not particularly limited, and may be preferably $1 \times 10^{-2}$ to 5% by weight. of the whole of the above-described resin composition, and in particular, more preferably 0.1 to 1% by weight. The content within the above-described range allows providing particularly enhanced effect for improving the adhesiveness.

The above-described resin composition may additionally contain a component other than the above-described components. For example, in order to improve various types of characteristics such as compatibility, stability and workability or the like of the resin, various types of additives may be appropriately added.

Such resin composition is dissolved in an aromatic hydrocarbon solvent such as toluene, xylene, an ester organic solvent such as ethyl acetate, butyl acetate, or a ketone organic solvent such as acetone, methyl ethyl ketone, and the obtained varnish is applied over a polyester sheet, and then they are dried at a temperature that causes volatilization of the above-described solvent to form an adhesive agent sheet, whereby obtaining the adhesive agent layer 3 formed on the polyester sheet.

Next, the adhesive agent layer 3 having a flux function is laminated on the side provided with solder bump 13 of the first substrate 1, and then the polyester sheet is delaminated to obtain the adhesive agent layer 3 having a flux function (S101, FIG. 3).

Next, at least one of the first substrate 1 and the second substrate 2 is heated and compressed to achieve a compressive deformation of the solder bump 13 and the protruded electrode 23 so that the sum of the height D [μm] of the solder bump 13 and the height E [μm] of the protruded electrode 23 is substantially equivalent to the thickness C [μm] of the adhesive agent layer 3 having a flux function (S103, FIG. 5).

Here, while the relation before compressive deformation among the height A [μm] of the solder bump 13, the height B of the protruded electrode 23 [μm] and the thickness C [μm] of the adhesive agent layer 3 having a flux function satisfies: A+B>C (FIG. 3), these are heated and compressed as described above to deform the solder bump 13 and the protruded electrode 23, so that the sum of the height D [μm] of the compressively deformed solder bump 13 and the height E [μm] of the compressively deformed protruded electrode 23 is substantially equivalent to the thickness C [μm] of the adhesive agent layer 3 having a flux function (FIG. 5). This allows preventing a phenomenon for remaining the adhesive agent layer 3 having a flux function caught between the solder bump 13 and the protruded electrode 23 (resin clogging). The reason for achieve the prevention of such resin clogging is that the solder bump 13 and the protruded electrode 23 are deformed so as to eliminate the adhesive agent layer 3 that covers the tip section 131 of the solder bump 13 having a flux function as described above.

The above-described heating and compressing, which causes a deformation so that the sum of the height D of the compressively deformed solder bump 13 and the height E of the compressively deformed protruded electrode 23 is substantially equivalent to the thickness C of adhesive agent layer 3 having a flux function, may preferably be conducted under a condition, in which a reaction for curing the thermosetting resin in the resin composition constituting the adhesive agent layer 3 having a flux function does not substantially proceed. More specifically, it is preferable to employ a temperature that is lower than the glass transition temperature of the thermosetting resin in the adhesive agent layer 3. This allows easily eliminating the adhesive agent layer 3 that covers the tip section of the solder bump 13 having a flux function.

More specific condition for the heating treatment is not particularly limited, and may be preferably at 80 to 150 degrees C. and for 5 seconds to 5 minutes, and in particular more preferably 90 to 120 degrees C. and for 30 seconds to 2 minutes. Further, the condition for compression is not particularly limited, and may be preferably 0.4 to 1.0 [MPa], and in particular more preferably 0.6 to 0.9 [MPa]. The heating and compressing condition within the above-described range provides improved effect for, in particular, reducing a generation of a void due to a failure in the filling of the adhesive agent layer 3 having a flux function generated in vicinity of the solder bump. Further, this provided improved effect for eliminating the adhesive agent layer 3 having a flux function from the section between the solder bump 13 and the protruded electrode 23, so that the joint of the solder bump 13 with the protruded electrode 23 can be easily formed without causing a resin clogging in a solder joint operation as discusses later.

Next, an operation for forming a solder connection by melting the solder to couple the solder bump 13 with the protruded electrode 23 is conducted. This allows providing the solder connection between the solder bump 13 and the protruded electrode 23 (S104, FIG. 6).

More specifically, it depends on the type of the solder, and in a case of employing, for example, tin-silver (Sn—Ag), it may be preferable to create a solder connection by heating at 220 to 260 degrees C. for 30 to 120 seconds, and in particular more preferably by heating at 230 to 240 degrees C. for 60 to 100 seconds.

Further, such heating may preferably conducted so that the thermosetting resin constituting the adhesive agent layer 3 is cured after the solder bump 13 and the protruded electrode 23 are melted. More specifically, it is preferable that the solder of the solder bump is melted before the thermosetting resin constituting the adhesive agent layer 3 is cured by the heating. This is because, if the thermosetting resin is cured before the melting of the solder, the shape of the solder connection is firmed by such cure of the thermosetting resin, possibly causing a failure in obtaining preferable shape.

On the contrary, when the heating is conducted for inducing the cure of the thermosetting resin constituting the adhesive agent layer 3 after the solder bump 13 and the protruded electrode 23 are melted as described above, the solder in the peripheral section (an end section) is also melted in addition to the solder in the tip section of the respective the solder bumps when the solder bump 13 and the protruded electrode 23 are compressed to be deformed, and thus a stable shape of the connection can be obtained.

The above-described minimum melt viscosity in the case that the melt viscosity in the event of elevating the temperature of the adhesive agent 3 having a flux function starting from an ambient temperature (25 degrees C.) until it reached to a melting state at a temperature ramp rate of 10 degrees C./minute, is first decreased in the initial stage until reaching to the minimum melt viscosity, and then is increased, is not particularly limited, and may be preferably 10 to 10,000 Pa·s, and more preferably 100 to 5,000 Pa·s, and in particular preferably 1,000 to 2,000 Pa·s. The minimum melt viscosity of the adhesive agent layer 3 having a flux function within the above-described range provides, in particular, enhanced effects for reducing voids generated in the adhesive agent layer in the thermal treatment by a moisture absorption of the electronic component or a gas component generated from the electronic component itself and for eliminating the adhesive agent layer between the solder bump 13 and the protruded electrode 23. The minimum melt viscosity of lower than the above lower limit may cause a scattering of the solder bump into the resin in the location other than the inter-terminal location due to a flow of the resin. The minimum melt viscosity of higher than the above-described upper limit may cause a failure in unification of the solder bumps, maintaining the shape of the pressed solder bumps.

Next, a curing operation for curing the adhesive agent layer 3 having a flux function by heating is conducted (S105). This allows ensuring appropriate physical properties (for example, thermal resistance, humidity resistance and the like) of the adhesive agent layer 3. The temperature in the above-described curing operation is not particularly limited provided that the temperature allows a cure of the thermosetting resin constituting the adhesive agent layer 3 having a flux function, and more specifically, it may preferably be 160 to 200 degrees C., and in particular more preferably 170 to 190 degrees C.

The method as described above allows the solder bump 13 of the first substrate 1 and the protruded electrode 23 of the second substrate 2 joined via the adhesive agent layer 3 having a flux function to form a solder connection section 5. While the junction is formed by filling the solder joint with an underfill material by utilizing the capillary phenomenon in the conventional technology, the use of the above-described method allows simultaneously conducting a formation of the shape of the solder joint for enhancing coupling reliability with conducting to provide a reinforcement of the solder joint section with the resins, thereby significantly reducing the operations. Further, insulating layers of a multiple-layered substrate, which have been formed by each layer, can be totally stacked in one process, and thus the conductor can be totally formed in one process.

Subsequently, advantageous effects of the present embodiment will be described. According to the method, the protruded electrode 23 is in contact with the solder bump 13 via the adhesive agent layer 3 and then the compressive bonding and deformation is further conducted, so that the convex-shaped configurations of both members can be utilized to eliminate the adhesive agent layer 3 from a contact point of the solder bump 13 and the protruded electrode 23 with higher efficiency. Further, the adhesive agent layer 3 is formed so as to satisfy a relation of: A+B>C, where a height of the solder bump 13 before the compressive deformation is presented as A [μm], a height of the protruded electrode 23 before the compressive deformation is presented as B [μm], and a thickness of the adhesive agent layer 3 is presented as C [μm], and the solder bump 13 and the protruded electrode 23 is compressively deformed so as to satisfy a relation of: D+E is substantially equivalent to C, where a height of the solder bump 13 after the compressive deformation is presented as D [μm], and a height of the protruded electrode 23 after the compressive deformation is presented as E [μm]. This allows eliminating the adhesive agent layer 3 without any residue in the contact point of the solder bump 13 and the protruded electrode 23. Therefore, enhanced electrical coupling can be obtained in the solder connection. Further, the use of the adhesive agent layer 3 having a flux function allows the solder extending over the protruded electrode with well-wetting condition as the solder of the solder bump 13 is melted, thereby providing further stable junction shape.

Conventionally, liquid epoxy is generally employed for a main ingredient and an acid anhydride containing phthalic anhydride is generally employed for a curing agent in the underfill material containing a flux mixed therein. The reason is that the acid anhydride itself in the curing agent has a flux effect, and further, an acid anhydride may be added at an excess amount of not smaller than an equivalent amount with epoxy as required so as to enhance the flux effect.

On the contrary, a phenolic resin is employed as a curing agent in the method of the present embodiment instead of an acid anhydride to obtain further improved reliability. It is found that this is because higher hygroscopic property of an acid anhydride such as phthalic anhydride easily causes an increase in the viscosity due to a moisture absorption before use and in use. Thus, an approach is proposed for providing a suitable control for the viscosity of the adhesive agent layer 3 in the operation (S103) for compressively bonding and deforming the solder bump 13 and the protruded electrode 23, so that a squash of the solder bump 13 and the protruded electrode 23 can more easily eliminate the adhesive agent layer 3.

More specifically, in the present embodiment, the adhesive agent layer 3 having the characteristic of the viscosity, which is first decreased as an increase of the temperature until reaching to the minimum melt viscosity and then is increased as an increase of the temperature, in the event of elevating the temperature starting from 25 degrees C. until it is melted at a temperature ramp rate of 10 degrees C./minute, is employed, and the minimum melt viscosity thereof is 10 to 10,000 Pa·s. Having such process, the adhesive agent layer 3 interposed between the solder bump 13 and the protruded electrode 23 can be effectively eliminated in the operation for compressively bonding and deforming the solder bump 13 and the protruded electrode 23. Therefore, a resin clogging, in which the adhesive agent layer 3 is caught between the solder bump 13 and the protruded electrode 23 in creating the solder connection can be effectively prevented to provide improved electrical coupling between the solder bump 13 and the protruded electrode 23.

Electronic components according to the present embodiment typically include, for example, an organic substrate having a solder bump, a ceramic substrate having a solder bump, a semiconductor element having a solder bump, and the like.

The method for providing solder joint according to the present embodiment can be employed to form a solder joint for an electronic equipment. Such electronic equipment typically includes, for example, a semiconductor device, which is formed by having an electrical connection with the above-described electronic component.

While the preferred embodiments of the present invention have been described above in reference to the annexed figures, it should be understood that the disclosures above are presented for the purpose of illustrating the present invention, and various modifications other than that described above are also available. For example, the embodiment has been described in reference to an exemplary implementation for forming the adhesive agent layer 3 in the same surface as the surface for forming the solder bump 13 provided in the first electronic component 1. Alternatively, the adhesive agent layer 3 may be formed in the same surface as the surface for forming the protruded electrode 23 provided in the second electronic component 2.

EXAMPLES

The present invention will be further described on the basis of examples and comparative examples in detail, though the present invention is not limited thereto.

Examples 1 to 6 and Comparative Example 1

Manufacture of Adhesive Tape

The respective components shown in Table 1 were dissolved in methyl ethyl ketone to obtain a resin varnish. Such resin varnish was applied over a polyester sheet, and was dried at 80 degrees C. for 3 minutes, and then was dried at 120 degrees C. for 3 minutes to obtain an adhesive agent layer (adhesive tape) having a flux function and having a thickness C (μm). Here, blending ratios in the table are presented as % by weight. for total amount of the blended components.
(Manufacture of Electronic Component)

Manufacture of First Substrate 1 (First Electronic Component 1 Having Solder Bump 13) and Second Substrate 2 (Second Electronic Component 2 Having Solder Bump 23 as Protruded Electrode)

A first electronic component 1 and a second electronic component 2 shown in FIG. 2 were manufactured as follows. A double-sided copper clad laminate having copper foils of 12 μm (commercially available from Sumitomo Bakelite Co. Ltd. under the trade name of ELC-4785GS) was etched to form a copper circuit pattern, and then the copper circuit pattern was roughened, and solder resists (commercially available from Taiyo Ink Mfg. Co., Ltd. under the trade name of PSR-AUS703) 14a, 14b, 24a and 24b were formed by printing over both sides at a thickness of 15 μm from the copper circuit, and an exposure and developing process was conducted to form an opening of 200 μm, and then a non-electrolytic nickel layer was formed at a thickness of 3 μm and a non-electrolytic gold-plated layer was formed at a thickness of 0.03 μm over the above-described opening in the copper circuit pattern, and further, solder (Sn/3.5Ag) paste was formed by printing so as to have a desired height, and a reflow process was conducted to melt the solder paste to obtain the first substrate 1 (substrate with solder bump) having the solder bump 13 of a height above the solder resist 14a of A μm and the second substrate 2 (substrate with solder bump) having the solder bump 23 of a height above the solder resist 24a of B μm. In addition to above, the melting temperature of the solder bumps 13 and 23 were 221 degrees C.

Manufacture of Multiple-Layered Circuit Board (Electronic Component)

The adhesive agent layer 3 with the flux function of a thickness of 30 μm was bonded on the surface having the solder bump 13 of the first substrate 1 formed therein with a vacuum press (commercially available from Meiki Co., Ltd. under the trade name of MVLP-500) at 120 degrees C. and 0.8 MPa for 30 seconds, and a polyester film was delaminated. Next, the solder bump 13 of the first substrate 1 was aligned with the solder bump 23 of the second substrate 2 so as to face each other, and the solder bumps 13 and 23 were heated and compressed at 120 degrees C. and 0.8 MPa for 30 seconds with the vacuum press while the solder bumps 13 and 23 were in contact with each other to cause a compressive deformation. Subsequently, there were compressed at 240 degrees C. and 0.3 MPa for 120 seconds with a flat plate power press (commercially available from System Kaihatsu under the trade name of MSA-2) to join the solder bumps 13 and 23. Further, in order to cure the adhesive agent layer 3, there were subjected to a thermal history at 180 degrees C. for 60 minutes to obtain a multiple-layered circuit board (electronic component).

The following evaluations were conducted for the adhesive agent layers 3 with the flux function (adhesion film with flux function) and electronic components as obtained in respective examples and comparative examples. The evaluation items are presented with the descriptions. The obtained results are shown in Table 1.
1. Measurement of Melt Viscosity The melt viscosity was measured by employing the obtained adhesion layer (adhesive tape) with the flux function. More specifically, an adhesive tape of a thickness of 100 μm was measured with a visco-elasticity measuring apparatus (commercially available from the Jusco International) at a temperature ramp rate of 10 degrees C./min. and at a frequency of 1.0 Hz in a mode of constant strain-stress detection, and in the case that, when the measurement was conducted by the atmospheric temperature of 300 degrees C., the minimum melt viscosity was investigated in the condition that the melt viscosity is first decreased in the initial stage until reaching to the minimum melt viscosity, and then is increased.

In addition to above, the adhesive tape of example 2 was thermally processed at 100 degrees C. for 60 minutes as a pre-curing before the solder bump 13 of the first substrate 1 was aligned with the solder bump 23 of the second substrate 2 so as to face each other. This partially accelerated the cure of the resin to suitably adjust the minimum melt viscosity.
2. Connectivity An interlayer connection resistance of the obtained multiple-layered circuit board (electronic component) was evaluated by measuring 20 spots of bump connection sections with a digital multi-meter. Both of the measurement in the condition after the manufacture of the multiple-layered circuit board and the measurements in the condition after 1,000 cycles of the thermal cycle consisting of −65 degrees C. for one hour and 150 degrees for one hour were carried out. The evaluation was conducted with n=20. Respective marks indicate the following conditions.

OO: 20 multiple-layered circuit boards achieved electric conductions at all bump connecting sections;

O: 18 to 19 multiple-layered circuit boards achieved electric conductions at all bump connecting sections;

Δ: 16 to 17 multiple-layered circuit boards achieved electric conductions at all bump connecting sections; and x: equal to or smaller than 15 multiple-layered circuit boards achieved electric conductions at all bump connecting sections.

3. Evaluation of Junction Cross Section

The obtained multiple-layered circuit boards were embedded with a cured epoxy resin, and the cross section was polished, 10 spots of the interlayer connection sections were observed by a scanning electron microscope (SEM). Respective marks indicate the following conditions.

O all ten spots exhibited stable connecting shape; and x: One or more spot(s) of failure in unifying the solder bumps or the bump having the shape that the solder flowed through the resin was (were) present.

4. Measurement of the Pressure Expansion Volume of the Adhesive Agent Layer

When the multiple-layered circuit board was manufactured, images were observed by permeability method with an ultrasonic flaw detector before and after the compression bonding with the flat plate power press, and the expansion of the adhesive agent layer was measured by an increase rate of the dimensional area. Respective marks indicate the following conditions.

OO: the expansion volume of the resin was equal to or less than 5.0%;

O: the expansion volume of the resin exceeded 5.0% and equal to or less than 10.0%;

Δ: the expansion volume of the resin exceeded 10.0% and equal to or less than 50.0%; and x: the expansion volume of the resin exceeded 50.0%.

TABLE 1

| | COMPONENT | | EXAMPLE 1 | EXAMPLE 2 | EXAMPLE 3 | EXAMPLE 4 |
|---|---|---|---|---|---|---|
| THERMOSETTING RESIN | EPOXY RESIN | NC6000, Nippon Kayaku Co., Ltd. | 50 | — | 10 | 50 |
| | | EPICLON-8406 DIC Corporation | — | 45 | — | — |
| | | ECON-1020-80 | — | — | 5 | — |
| RESIN HAVING FLUX ACTIVITY | 3,5-DIHYDROXY-2-NAPHTHOIC ACID | TOKYO CHEMICAL INDUSTRY CO., LTD. | — | 9 | — | — |
| | ADIPIC ACID | TOKYO CHEMICAL INDUSTRY CO., LTD. | 4 | — | 5 | 4 |
| CURING AGENT | PHENOLIC RESIN | PR53647 SUMITOMO BAKELITE Co., LTD. | 15 | 20 | — | 15 |
| | | PR-HF-3 | — | — | 3 | — |
| | | MEH8000 | — | — | 6 | — |
| FILM-FORMING RESIN | ACRYLIC RUBBER | SG-708-6, Nagase ChemteX Corporation | 30 | — | 60 | 30 |
| | PHENOXY RESIN | YP-50 Tohto Kasei Co., Ltd. | — | 25 | — | — |
| | | epicoat 4250 | — | — | 10 | — |
| SILANE-COUPLING AGENT | EPOXY SILANE | KBM-303, Shin-Etsu Chemical Co., Ltd. | 1 | 1 | 1 | 1 |
| PRE-CURING | TEMPERATURE FOR SUPPLYING FIRST SUBSTRATE WITH ADHESIVE AGENT LAYER IN OVEN (° C.) | | — | 100 | — | — |
| | TIME FOR SUPPLYING FIRST SUBSTRATE WITH ADHESIVE AGENT LAYER IN OVEN (min) | | — | 60 | — | — |
| Melt Viscosity (Pa · s) | | | 1496 | 32.7 | 8234 | 1496 |
| [TOTAL HEIGHT OF THE SOLDERS BEFORE COMPRESSIVE DEFORMATION A + B] − [FILM THICKNESS C] (μm) | | | 30 | 30 | 30 | 20 |
| TOTAL HEIGHT OF THE SOLDERS BEFORE COMPRESSIVE DEFORMATION A + B (μm) | | | 60 | 60 | 60 | 50 |
| FILM THICKNESS C (μm) | | | 30 | 30 | 30 | 30 |
| TOTAL HEIGHT OF THE SOLDERS AFTER COMPRESSIVE DEFORMATION D + E (μm) | | | 30 | 29 | 31 | 30 |
| (D + E)/C | | | 1.00 | 0.97 | 1.03 | 1.00 |
| α = (D + E)/(A + 8) | | | 0.50 | 0.48 | 0.52 | 0.60 |
| CONNECTIVITY | | | oo | oo | o | oo |
| CROSS-SECTION OF JOINT | | | o | o | o | o |
| PRESSURE EXPANSION VOLUME OF RESIN | | | oo | o | oo | oo |

| | COMPONENT | | EXAMPLE 5 | EXAMPLE 6 | COMPARATIVE EXAMPLE 1 |
|---|---|---|---|---|---|
| THERMOSETTING RESIN | EPOXY RESIN | NC6000, Nippon Kayaku Co., Ltd. | 50 | 18 | 50 |
| | | EPICLON-8406 DIC Corporation | — | — | — |
| | | ECON-1020-80 | — | 10 | — |

TABLE 1-continued

| | | | | | |
|---|---|---|---|---|---|
| RESIN HAVING FLUX ACTIVITY | 3,5-DIHYDROXY-2-NAPHTHOIC ACID | TOKYO CHEMICAL INDUSTRY CO., LTD. | — | — | — |
| | ADIPIC ACID | TOKYO CHEMICAL INDUSTRY CO., LTD. | 4 | 4 | 4 |
| CURING AGENT | PHENOLIC RESIN | PR53647 SUMITOMO BAKELITE Co., LTD. | 15 | — | 15 |
| | | PR-HF-3 | — | 5 | — |
| | | MEH8000 | — | 10 | — |
| FILM-FORMING RESIN | ACRYLIC RUBBER | SG-708-6, Nagase ChemteX Corporation | 30 | 40 | 30 |
| | PHENOXY RESIN | YP-50 Tohto Kasei Co., Ltd. | — | — | — |
| | | epicoat 4250 | — | 12 | — |
| SILANE-COUPLING AGENT | EPOXY SILANE | KBM-303, Shin-Etsu Chemical Co., Ltd. | 1 | 1 | 1 |
| PRE-CURING | TEMPERATURE FOR SUPPLYING FIRST SUBSTRATE WITH ADHESIVE AGENT LAYER IN OVEN (° C.) | | — | — | — |
| | TIME FOR SUPPLYING FIRST SUBSTRATE WITH ADHESIVE AGENT LAYER IN OVEN (min) | | — | — | — |
| Melt Viscosity (Pa · s) | | | 1495 | 1951 | 1496 |
| [TOTAL HEIGHT OF THE SOLDERS BEFORE COMPRESSIVE DEFORMATION A + B] − [FILM THICKNESS C] (μm) | | | 35 | 30 | 0 |
| TOTAL HEIGHT OF THE SOLDERS BEFORE COMPRESSIVE DEFORMATION A + B (μm) | | | 55 | 60 | 30 |
| FILM THICKNESS C(μm) | | | 30 | 30 | 30 |
| TOTAL HEIGHT OF THE SOLDERS AFTER COMPRESSIVE DEFORMATION D + E (μm) | | | 30 | 30 | 28 |
| (D + E)/C | | | 1.00 | 1.00 | 0.93 |
| α = (D + E)/(A + 8) | | | 0.45 | 0.50 | 0.93 |
| CONNECTIVITY | | | ○○ | ○○ | x |
| CROSS-SECTION OF JOINT | | | ○ | ○ | x |
| PRESSURE EXPANSION VOLUME OF RESIN | | | ○○ | ○○ | ○ |

As can be seen from Table 1, examples 1 to 6 exhibit enhanced connectivity.

Further, examples 1 to 6 exhibited stable cross-sectional geometry of the solder junction and thus enhanced reliability was suggested.

Further, it was suggested that examples 3 to 6 exhibited smaller expansion of the resin and thus reduced contamination to the electronic component was evidenced.

Example 7

According to the process for manufacturing the electronic component as described above, the first substrate (substrate with solder bump) having the solder bump of a height above the solder resist of 40 μm and the second substrate (substrate with solder bump) having the solder bump of a height above the solder resist of 40 μm were obtained. Subsequently, as described above, the solder bump of the first substrate is joined to the solder bump of the second substrate by employing the adhesive tape of example 1 to manufacture the multiple-layered circuit board (electronic component). The connectivity, the junction cross section, and the expansion of the adhesive agent layer by the compression were evaluated for the obtained multiple-layered circuit boards according to the above-described method.

In example 7, [total of height of the solder bumps A+B]−[film thickness C]=50 μm before the compressive deformation, and [total of height of the solder bumps D+E] after the compressive deformation=32 μm, and thus the similar results as obtained results in example 1 for the connectivity, the cross-sectional geometry of the solder junction and the expansion of the resin were obtained. In addition to above, the value of (D+E)/C can be calculated as 32/30=1.07, and the value of α=(D+E)/(A+B) can be calculated as 32/80=0.40.

Example 8

According to the process for manufacturing the electronic component as described above, the first substrate (substrate with solder bump) having the solder bump of a height above the solder resist of 18 μm and the second substrate (substrate with solder bump) having the solder bump of a height above the solder resist of 18 μm were obtained. Subsequently, as described above, the solder bump of the first substrate is joined to the solder bump of the second substrate by employing the adhesive tape of example 1 to manufacture the multiple-layered circuit board (electronic component). The connectivity, the junction cross section, and the expansion of the adhesive agent layer by the compression were evaluated for the obtained multiple-layered circuit boards according to the above-described method.

In example 8, [total of height of the solder bumps A+B]−[film thickness C]=6 μm before the compressive deformation, and [total of height of the solder bumps D+E] after the compressive deformation=28 μm. Although no problem on the practical use was occurred, the result slightly inferior to the connectivity as compared with the result of example 7 was obtained. In addition to above, the value of (D+E)/C can be calculated as 28/30=0.93, and the value of α=(D+E)/(A+B) can be calculated as 28/36=0.78.

The other aspect of the present invention will be described below.

(1) A method for providing a solder connection, which electrically connects a first electronic component having a first solder bump to a second electronic component having a protruded electrode to provide electrical connection between the first solder bump and the protruded electrode, wherein a relation of: A+B>C is satisfied, where a height of said first solder bump from one surface of the first electronic component is presented as A [μm], a height of said protruded electrode from one surface of the second electronic component is presented as B [μm], and a thickness of said adhesive agent layer having the flux function is presented as C [μm], and further comprising: disposing the adhesive agent layer having the above-described the flux function in the first electronic component;

and heating and compressing the first solder bump and the protruded electrode to deform the first solder bump and the protruded electrode and providing a contact of the above-described protruded electrode with the above-described first solder bump, so that the sum of the height A [μm] of the first solder bump and the height B [μm] of the above-described protruded electrode is substantially equivalent to the thickness C [μm] of the above-described adhesive agent layer having the flux function.

(2) The method for providing the solder connection as set forth in the above-described (1), further including a cure operation for curing the above-described adhesive agent layer having the flux function.

(3) The method for providing the solder connection as set forth in the above-described (1), wherein the above-described adhesive agent layer having the flux function is composed of a resin composition containing a thermosetting resin and a compound exhibiting a flux activity.

(4) The method for providing the solder connection as set forth in the above-described (1), wherein the heating is conducted in the above-described operation for providing the contact so that the above-described thermosetting resin is cured after the above-described solder bumps are melted.

(5) The method for providing the solder connection as set forth in the above-described (4), wherein the melt viscosity in the event of elevating the temperature of the adhesive agent having a flux function starting from an ambient temperature until it reached to a melting state at a temperature ramp rate of 10 degrees C./minute, is first decreased in the initial stage until reaching to the minimum melt viscosity, and then is increased, and wherein said minimum melt viscosity is 10 to 10,000 Pas (6) An electronic equipment having the solder connection section provided by the method for providing the solder connection as set forth in the above-described (1) to (5).

The invention claimed is:

1. A method for providing a solder connection, which electrically connects a first electronic component having a solder bump to a second electronic component having a protruded electrode, comprising:
   forming an adhesive agent layer in a surface that is the same with one surface of a surface for forming said solder bump provided in said first electronic component and a surface for forming said protruded electrode provided in said second electronic component;
   disposing said solder bump so as to face said protruded electrode to align said first electronic component with said second electronic component; and
   heating and compressing said solder bump and said protruded electrode while said solder bump and said protruded electrode in mutually facing arrangement are in contact with each other to cause a compressive deformation of said solder bump and said protruded electrode, wherein said adhesive agent layer is formed in said forming said adhesive agent layer so as to satisfy a relation of: A+B>C,
where a height of said solder bump before the compressive deformation is presented as A [μm], a height of said protruded electrode before the compressive deformation is presented as B [μm], and a thickness of said adhesive agent layer is presented as C [μm], and
   wherein said solder bump and said protruded electrode are deformed in said heating and compressing said solder bump and said protruded electrode so as to satisfy a relation of: D+E is substantially equivalent to C, where a height of said solder bump after the compressive deformation is presented as D [μm], and a height of said protruded electrode after the compressive deformation is presented as E [μm].

2. The method for providing the solder connection as set forth in claim 1, wherein said solder bump and said protruded electrode is deformed in said heating and compressing said solder bump and said protruded electrode so as to satisfy a relation of:

$$0.9 \times C \leq D+E \leq 1.1 \times C.$$

3. The method for providing the solder connection as set forth in claim 1, further comprising curing said adhesive agent layer, after said heating and compressing said solder bump and said protruded electrode.

4. The method for providing the solder connection as set forth in claim 2, wherein said adhesive agent layer is of a resin composition containing a thermosetting resin, and said method further includes pre-curing said adhesive agent layer, before disposing said solder bump.

5. The method for providing the solder connection as set forth in claim 2, wherein said adhesive agent layer is of a resin composition containing a thermosetting resin, and said method further includes:
   melting said solder bump and said protruded electrode to join thereof, after said heating and compressing said solder bump and said protruded electrode, and
   post-curing said adhesive agent layer, after melting said solder bump and said protruded electrode.

6. The method for providing the solder connection as set forth in claim 2, wherein, in said heating and compressing said solder bump and said protruded electrode, said solder bump and said protruded electrode are heated at a temperature lower than a melting temperature of said solder bump.

7. The method for providing the solder connection as set forth in claim 1, wherein viscosity of said adhesive agent layer measured at a frequency of 1.0 Hz in the event of elevating the temperature starting from 25 degrees C. until it is melted at a temperature ramp rate of 10 degrees C./minute, is first decreased as an increase of the temperature until reaching to the minimum melt viscosity, and then is increased as an increase of the temperature, and wherein said minimum melt viscosity is 10 to 10,000 Pa·s.

8. The method for providing the solder connection as set forth in claim 2, wherein viscosity of said adhesive agent layer measured at a frequency of 1.0 Hz in the event of elevating the temperature starting from 25 degrees C. until it is melted at a temperature ramp rate of 10 degrees C./minute, is first decreased as an increase of the temperature until reaching to the minimum melt viscosity, and then is increased as an increase of the temperature, and wherein said minimum melt viscosity is 10 to 10,000 Pa·s.

9. The method for providing the solder connection as set forth in claim 5, wherein viscosity of said adhesive agent layer measured at a frequency of 1.0 Hz in the event of elevating the temperature starting from 25 degrees C. until it is melted at a temperature ramp rate of 10 degrees C./minute, is first decreased as an increase of the temperature until reaching to the minimum melt viscosity, and then is increased as an increase of the temperature, and wherein said minimum melt viscosity is 10 to 10,000 Pa·s.

10. The method for providing the solder connection as set forth in claim 2, wherein $\alpha$ is 0.3 to 0.9, where $\alpha$ is defined as $\alpha=(D+E)/(A+B)$.

11. The method for providing the solder connection as set forth in claim 2, wherein said adhesive agent layer is composed of a resin composition containing a thermosetting resin and a compound exhibiting a flux activity.

12. The method for providing the solder connection as set forth in claim 11, wherein said resin composition further contains a curing agent and substantially no acid anhydride.

13. The method for providing the solder connection as set forth in claim 12, wherein said thermosetting resin is an epoxy resin,
   said compound exhibiting a flux activity is an aliphatic carboxylic acid or an aromatic carboxylic acid, and said curing agent is a phenolic resin.

14. The method for providing the solder connection as set forth in claim 13,
   wherein said aliphatic carboxylic acid is adipic acid, and said aromatic carboxylic acid is 3,5-dihydroxy-2-naphthoic acid.

15. The method for providing the solder connection as set forth in claim 5,
   wherein said adhesive agent layer further contains a compound exhibiting a flux activity and a curing agent,
   said thermosetting resin is an epoxy resin,
   said compound exhibiting a flux activity is an aliphatic carboxylic acid or an aromatic carboxylic acid, and
   said curing agent is a phenolic resin.

16. The method for providing the solder connection as set forth in claim 6,
   wherein said adhesive agent layer contains a thermosetting resin,
   a compound exhibiting a flux activity, and curing agent,
   said thermosetting resin is an epoxy resin,
   said compound exhibiting a flux activity is an aliphatic carboxylic acid or an aromatic carboxylic acid, and
   said curing agent is a phenolic resin.

17. An electronic equipment including a solder connection connected by the method for providing the solder connection as set forth in claim 1.

18. A method for manufacturing an electronic equipment by employing the method for providing the solder connection as set forth in claim 1.

* * * * *